(12) United States Patent
Pascal et al.

(10) Patent No.: US 9,300,314 B2
(45) Date of Patent: Mar. 29, 2016

(54) ARRANGEMENT FOR READING OUT AN ANALOG VOLTAGE SIGNAL

(71) Applicant: ABB TECHNOLOGY AG, Zürich (CH)

(72) Inventors: Joris Pascal, Baden (CH); Richard Bloch, Nussbaumen (CH)

(73) Assignee: ABB TECHNOLOGY AG, Zurich (CH)

( * ) Notice: Subject to any disclaimer, the term of this patent is extended or adjusted under 35 U.S.C. 154(b) by 0 days.

(21) Appl. No.: 14/054,921

(22) Filed: Oct. 16, 2013

(65) Prior Publication Data

US 2014/0176357 A1 Jun. 26, 2014

Related U.S. Application Data

(63) Continuation of application No. PCT/EP2011/001941, filed on Apr. 16, 2011.

(51) Int. Cl.
*H03M 1/12* (2006.01)
*H03M 1/10* (2006.01)

(52) U.S. Cl.
CPC .............. *H03M 1/12* (2013.01); *H03M 1/1004* (2013.01); *H03M 1/1019* (2013.01); *H03M 1/1028* (2013.01); *H03M 1/129* (2013.01)

(58) Field of Classification Search
CPC ... H03M 1/468; H03M 1/804; H03M 1/0682; H03M 1/442; H03M 1/12; H03M 1/1038; H03M 1/466; H03M 1/403; H03M 1/124; H03M 1/0607; H03M 1/1023
USPC .................................. 341/118–121, 155, 172
See application file for complete search history.

(56) References Cited

U.S. PATENT DOCUMENTS

| | | | | |
|---|---|---|---|---|
| 4,908,624 A | * | 3/1990 | Goto et al. | 341/172 |
| 6,424,277 B1 | * | 7/2002 | Outram | G01R 35/00 |
| | | | | 341/118 |
| 6,822,601 B1 | | 11/2004 | Liu et al. | |
| 6,970,126 B1 | * | 11/2005 | O'Dowd | H03M 3/34 |
| | | | | 341/143 |
| 7,129,875 B1 | * | 10/2006 | Altun | H03M 3/322 |
| | | | | 341/120 |

(Continued)

OTHER PUBLICATIONS

International Search Report (PCT/ISA/210) mailed on Dec. 29, 2011, by the European Patent Office as the International Searching Authority for International Application No. PCT/EP2011/001941.

(Continued)

*Primary Examiner* — Linh Nguyen
(74) *Attorney, Agent, or Firm* — Buchanan Ingersoll & Rooney PC

(57) ABSTRACT

An arrangement for reading out an analog voltage signal includes a voltage signal input for applying the analog voltage signal thereto, a reference unit configured to generate an analog reference voltage, and a converting unit configured to convert an analog input signal into a digital output signal. To enable online self-calibration of the arrangement, the arrangement includes a superposition unit configured to receive the analog voltage signal and the analog reference voltage. The superposition unit includes a modulation unit configured to generate a modulated reference voltage from the analog reference voltage. The superposition unit is configured to generate a combined analog signal by superimposing the modulated reference voltage onto the analog voltage signal, and to forward the combined analog signal to the converting unit.

19 Claims, 5 Drawing Sheets

(56) References Cited

U.S. PATENT DOCUMENTS

| | | | | |
|---|---|---|---|---|
| 7,423,568 B2* | 9/2008 | Hellwig | ............ | G01D 5/24 341/143 |
| 7,696,910 B2* | 4/2010 | Koyama | ............ | H03M 3/328 341/131 |
| 8,344,928 B2* | 1/2013 | Guedon | ............ | H03M 3/356 341/143 |
| 8,749,415 B2* | 6/2014 | Jung | ............ | H03M 3/418 341/143 |
| 2003/0210166 A1* | 11/2003 | Liu | ............ | H03M 3/34 341/172 |
| 2007/0046523 A1* | 3/2007 | Wang | ............ | H03M 1/66 341/172 |
| 2007/0229331 A1* | 10/2007 | Pertijs et al. | ............ | 341/120 |
| 2008/0007442 A1* | 1/2008 | Oprescu | ............ | H03M 3/49 341/155 |
| 2012/0200440 A1* | 8/2012 | Okada | ............ | H03M 3/38 341/143 |

OTHER PUBLICATIONS

Written Opinion (PCT/ISA/237) mailed on Dec. 29, 2011, by the European Patent Office as the International Searching Authority for International Application No. PCT/EP2011/001941.

* cited by examiner

US 9,300,314 B2

ARRANGEMENT FOR READING OUT AN ANALOG VOLTAGE SIGNAL

RELATED APPLICATION

This application claims priority as a continuation application under 35 U.S.C. §120 to PCT/EP2011/001941, which was filed as an International Application on Apr. 16, 2011 designating the U.S. The entire content of this application is hereby incorporated by reference in its entirety.

FIELD

The present disclosure relates to an arrangement for reading out an analog voltage signal. The arrangement includes a voltage signal input for applying the analog voltage signal thereto, a converting means for converting an analog signal into a digital signal, and a reference means for generating an analog reference voltage. Such an arrangement is also known under the term readout electronics or front end electronics, and it is used to generate a digital voltage signal from an analog voltage signal which can then be further processed digitally. Known devices with such readout electronics can be, for example, multimeters, instrument transformers or sensor interfaces.

BACKGROUND INFORMATION

In order to be able to guarantee a highly reliable digital signal, readout electronics can be required to exhibit high initial accuracy, as well as high temperature and ageing stability. In addition, the high accuracy needs to be ensured over the whole specified temperature range and over a predefined time period, where the predefined time period may be the time between a manual calibration of the readout electronics and the next. During manual calibration, the manufacturer of the readout electronics applies an external standard reference voltage to the voltage signal input of the arrangement and uses the resulting digital signal to estimate and correct the gain error of the arrangement. The time period between two manual calibrations is extendable by enabling the arrangement for self-calibration. This is, for example, known under the term auto-calibration from the 3458A Multimeter by Agilent Technologies, as is described in the corresponding Calibration Manual, Manual Part Number 03458-90017. For the auto-calibration, the 3458A is equipped with internal reference standards, and the estimation and correction of gain errors is performed automatically whenever the auto-calibration function is invoked. During auto-calibration, the multimeter cannot be used for measurement purposes.

FIG. 1 shows a schematic diagram of known readout electronics, with a self-calibration circuit to correct the gain error of the readout electronics. The gain of the readout electronics is summarized by the series connection of a gain block $G_A$ and converting means ADC having a gain $G_B$. The input signal to the readout electronics is, under normal working conditions, an analog voltage signal $V_{in}$, which is transformed into a corresponding digital output signal 2. For self-calibration purposes, internal reference means ref generate an analog reference voltage $V_{ref}$ which is applied to an input switch 3 as well as to the converting means ADC. When self-calibration is desired, the input switch 3 needs to be operated in order to switch over from the analog voltage signal $V_{in}$ to the reference voltage $V_{ref}$. The digital output signal 2 of the converting means ADC is then expected to be equal to the overall gain of the readout electronics $G_A \cdot G_B$, since the digital output signal 2 equals the digitized value of the analog input signal 1 divided by the digitized value of the reference voltage $V_{ref}$, i.e. it equals to $G_A \cdot G_B \cdot V_{ref}/V_{ref}$. A discrepancy between the digital output signal 2 and the expected value $G_A \cdot G_B$ indicates the gain error of the readout electronics, the value of which is stored. Switch 3 is then operated back to apply the analog voltage signal $V_{in}$, and the gain error is used to correct the digital output signal 2 generated from the analog voltage signal $V_{in}$.

In the area of power transmission and distribution, voltages and currents can be measured by sensors for which it is desirable to perform self-calibration of the corresponding readout electronics without interrupting the current path of the analog voltage signal $V_{in}$, so that the availability of the readout electronics is increased and manual interaction with the sensors is reduced. This type of self-calibration can also be called online self-calibration.

Therefore, exemplary embodiments of the present disclosure provide an arrangement for reading out an analog voltage signal which, at the same time, delivers a signal which can be used to calibrate the arrangement without needing to disconnect the analog voltage signal.

SUMMARY

An exemplary embodiment of the present disclosure provides an arrangement for reading out an analog voltage signal. The exemplary arrangement includes a voltage signal input for applying the analog voltage signal thereto, reference means for generating an analog reference voltage, and converting means for converting an analog input signal into a digital output signal. In addition, the exemplary arrangement includes superposition means for receiving the analog voltage signal and the analog reference voltage. The superposition means include modulation means for generating a modulated reference voltage from the analog reference voltage. The superposition means are configured for generating a combined analog signal by superimposing the modulated reference voltage onto the analog voltage signal and for forwarding the combined analog signal to the converting means.

BRIEF DESCRIPTION OF THE DRAWINGS

Additional refinements, advantages and features of the present disclosure are described in more detail below with reference to exemplary embodiments illustrated in the drawings, in which.

DETAILED DESCRIPTION

Figure 1:
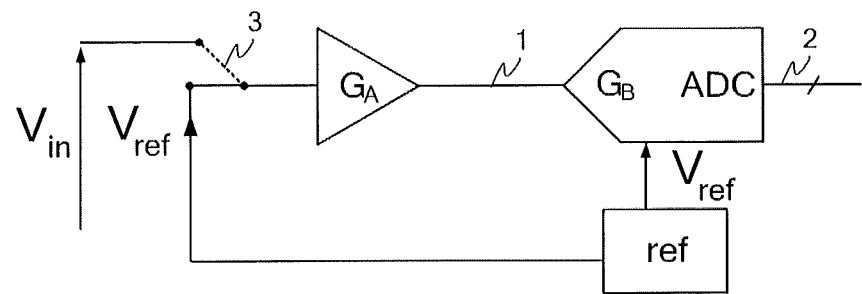
FIG. 1 is a schematic diagram of a known readout electronics circuit with self-calibration.

An exemplary embodiment of the present disclosure provides an arrangement which includes a voltage signal input for applying the analog voltage signal thereto, a converting means for converting an analog signal into a digital signal, and a reference means for generating an analog reference voltage. The arrangement of the present disclosure also includes a superposition means which can be configured to receive both the analog voltage signal and the analog reference voltage as input signals. The superposition means includes modulation means for generating a modulated reference voltage from the analog reference voltage, and is configured to generate a combined analog signal by superimposing the modulated reference voltage onto the analog voltage signal and forward the combined analog signal to the converting means for digitization. By superimposing the reference voltage onto the analog voltage signal, both signals can be transmitted concurrently to the converting unit so that both voltages can be processed and used for calibration purposes as well as for uninterrupted measurement purposes. By modulating the reference voltage, its separation from the voltage signal itself as well as from any possible DC offset is facilitated.

In accordance with an exemplary embodiment of the present disclosure, the superposition means includes a first superposition switching means for alternately applying either the analog voltage signal or the modulated reference voltage to a signal output of the superposition means, where the first superposition switching means can be configured to be operated at a superposition frequency which is at least ten times higher than an ADC sampling frequency of the converting means (ADC—Analog to Digital Conversion). By using a significantly higher superposition frequency compared to the ADC sampling frequency of the converting means it is ensured that both the analog voltage signal and the modulated reference voltage can be transformed without losing any information during the superposition as well as the analog to digital conversion, so that the corresponding waveforms could be restored correctly afterwards. By using simple switching means to achieve the superposition, a cost effective solution is provided, compared to more complex circuitry or even a signal processor.

In accordance with an exemplary embodiment, the modulation means can be configured to generate a square wave modulated reference voltage. A square wave can be generated with higher accuracy compared to, for example, a sine wave, which is an important aspect with respect to readout electronics.

In a solution to generate a square wave modulated reference voltage and to superimpose it onto the analog voltage signal in order to generate the combined analog signal, the reference means generate a DC analog reference voltage, the modulation means include a first capacitor and first modulation switching means to alternately charge the first capacitor to either the analog reference voltage or to an inverted analog reference voltage, where the analog reference voltage is a DC voltage. The first superposition switching means are configured to periodically include and exclude the first capacitor in and from the current path of the analog voltage signal. Using a capacitor for generating the square wave ensures a highly accurate signal, since the DC level of the positive and negative analog reference voltage is reached independently of the value of the capacitance used for the capacitor.

In accordance with an exemplary embodiment, a second capacitor and second modulation switching means are provided in the modulation means, where the second modulation switching means can be configured to alternately charge the second capacitor to either the analog reference voltage or to the inverted analog reference voltage. In addition, the superposition means include second superposition switching means configured to be operated at the same superposition frequency as the first superposition switching means. In this exemplary embodiment, the first and the second superposition switching means can be configured to alternately include either the first capacitor or the second capacitor in the current path of the analog voltage signal. In this exemplary arrangement, one of the two capacitors is charged to the positive or negative DC analog reference voltage, while the other of the two capacitors is charged to the voltage of the analog voltage signal, and vice versa. By using two capacitors and switching over periodically between them so that at any time only one capacitor is included in the current path while the other capacitor is getting charged, it is avoided that the time periods during which the capacitors can be discharged become visible in the waveform of the output signal, i.e. the combined analog signal.

Exemplary high switching frequencies can be achieved with semiconductor switches, for example. Therefore, according to an exemplary embodiment, the first and second superposition switching means and the first and second modulation switching means can be semiconductor switches, such as CMOS (Complementary Metal Oxide Semiconductor) switches, for example.

It is important to note that in the known self-calibration circuitry of FIG. 1, a relay or relays can be used for the input switch 3. Relays can be known to have a sufficiently high voltage withstand so that they can not only be used in readout electronics of low voltage multimeters, but also for the readout electronics of high or medium voltage sensors or instrument transformers used, for example, in the power transmission and distribution industry. However, relays have a limited switching frequency of less than 1 kHz. This switching frequency range is too low in cases where the above-described arrangement is intended to be used for ADC sampling frequencies of more than 100 Hz, or in other words for sampling rates of more than 100 samples per second, since in these cases a superposition frequency of at least 1 kHz is required.

In accordance with an exemplary embodiment of the present disclosure, adjusting means, which are configured to adjust the analog voltage signal to a desired increased or decreased voltage level, can be connected between the voltage signal input and the superposition means. Such adjusting means can be particularly useful when the analog voltage signal has a comparatively high voltage level, as, for example, in the case of a Rogowski coil used for the measurement of currents in power transmission and distribution lines, which has an output voltage level of several ten up to several hundred Volts. The voltage level is then reduced by the adjusting means in order to ensure that the withstand voltages of the elements of the readout electronics are not exceeded. CMOS switches have a comparatively low withstand voltage of about 40 V, so that in cases when a high ADC sampling rate and therefore CMOS switches can be required for analog voltage signals at levels above 40 V, the adjusting means need to be applied. The insertion of the adjusting means between the voltage signal input and the superposition means has the advantage that any gain error introduced by the adjusting means can be corrected afterwards, since the adjusting means become part of the online self-calibration arrangement.

In accordance with an exemplary embodiment of the present disclosure, the adjusting means can be a resistive divider.

In case of a resistive divider, its resistor elements form together with the first capacitor an RC-filter which has an RC time constant. According to an exemplary embodiment, the first and second superposition switching means can be configured to be operated at a superposition frequency which is at least a hundred times higher than the inverse RC time constant. If the first capacitor has a capacitance value of $C_1$ and the resistive divider includes two resistors with resistance values $R_1$ and $R_2$, the RC time constant $T_0$ of the RC-filter is $T_0 = C_1 \cdot (R_1 + R_2)$, and the superposition frequency shall be $f_H > 100/T_0$.

In accordance with an exemplary embodiment, the output of the superposition means is connected to the positive input of a differential amplifier, and the output of the differential amplifier is then connected to the converting means.

This exemplary embodiment can be extended by connecting the inputs of further superposition means to further adjusting means and to the reference means, where the further superposition means can be configured for generating a further combined signal by superimposing an inverted modulated reference voltage onto the analog voltage signal and where the output of the further superposition means is connected to the negative input of the differential amplifier.

The arrangement according to the disclosure can be implemented, for example, as discrete electronic elements on a printed circuit board or as an application-specific integrated circuit (ASIC).

Figure 2:
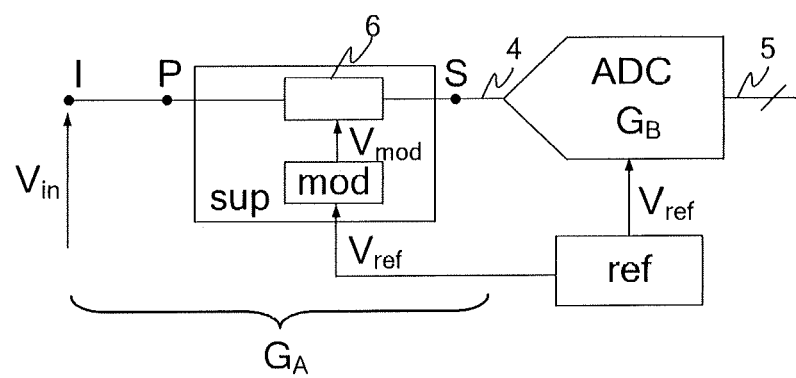
FIG. 2 is a schematic diagram of an arrangement according to an exemplary embodiment of the present disclosure.

In FIG. 2, a schematic diagram of an arrangement according to an exemplary embodiment of the present disclosure is depicted. The arrangement includes the same converting means ADC and reference means ref as already described with respect to the known readout electronics of FIG. 1. However, in contrast to FIG. 1, where the readout electronics of FIG. 1 provides for an offline self-calibration functionality due to the input signal being switched over from the analog voltage signal $V_{in}$ to the reference voltage $V_{ref}$ during calibration, the arrangement of FIG. 2 allows for online self-calibration. This is due to the presence of superposition means sup which can be arranged between a node P and a node S as part of the readout electronics and which. The superposition means sup include modulation means mod for generating a modulated reference voltage $V_{mod}$ by modulation of the analog reference voltage $V_{ref}$. The superposition means sup can be further configured to superimpose the modulated reference voltage $V_{mod}$ onto the analog voltage signal $V_{in}$. The superposition is performed by an actual superposition element 6. The output signal of the superposition means sup is called a combined analog signal 4. The analog voltage signal $V_{in}$ is applied to the arrangement via a voltage signal input, depicted as node I. The overall gain of the arrangement of FIG. 2 is again $G_A \cdot G_B$, with $G_B$ being the gain of the converting means ADC and $G_A$ being the gain of all elements between the voltage signal input, node I, and the input of the converting means ADC, which is the node S in FIG. 2. The output signal 5 of the converting means ADC can be expressed as the following sum:

$$\text{signal } 5 = G_A \cdot G_B \cdot \frac{V_{mod}}{V_{ref}} + G_A \cdot G_B \cdot \frac{V_{in}}{V_{ref}}.$$

Signal 5 is commonly input to a processing device (not shown), where the processing device digitally separates the two parts of the sum, determines the gain $G_A \cdot G_B$, compares it with the expected gain of the readout electronics and thereby derives the gain error. The gain error is then used to correct the digital value corresponding to the analog voltage signal $V_{in}$. In addition to this online self-calibration, it is also possible to perform an online external calibration, with an external standard voltage. In order to correct the absolute error due to the drift of the analog reference voltage $V_{ref}$, the digital value derived from reading directly the analog reference voltage $V_{ref}$ is compared with the digital value generated from the external standard voltage, without needing to interrupt the reading and transformation process of the analog voltage signal $V_{in}$.

Figure 3:
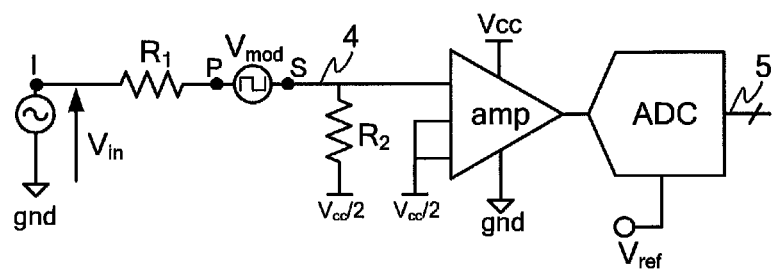
FIG. 3 is a schematic diagram of an arrangement according to an exemplary embodiment of the present disclosure.

An exemplary embodiment of the present disclosure according to FIG. 3 differs from the exemplary embodiment of FIG. 2 in that the superposition means between nodes P and S can be depicted as a voltage source which delivers the modulated reference voltage $V_{mod}$ in the form of a square wave voltage signal and which is arranged in the current path of the analog voltage signal $V_{in}$. A differential amplifier amplifier, supplied by a supply voltage $V_{cc}$, is arranged between the output of the superposition means and the input of the converting means ADC, where the output of the superposition means is connected to the positive input of the amplifier amp. The negative input of the amplifier is connected to the middle potential $V_{cc}/2$. Adjusting means, implemented as a resistive voltage divider which includes a first resistor $R_1$ between nodes I and P and a second resistor $R_2$ between node S and a reference potential of half the supply voltage $V_{cc}/2$, is intended to decrease the voltage level of the analog voltage signal $V_{in}$ to a level suitable to the supply voltage level of the electronics. For example, if the analog voltage signal $V_{in}$ is the output signal of a Rogowski coil with a voltage level of up to 400 V and the voltage supply of the electronics has a level of 5V, the voltage divider can be designed to divide this signal by eighty. Since the adjusting means and the instrumentation amplifier amp can be included between the voltage signal input node I and the input of the converting means, they become part of those elements of the readout electronics arrangement which belong to gain $G_A$, that is, any gain error introduced by them is corrected by the online self-calibration.

Figure 4:
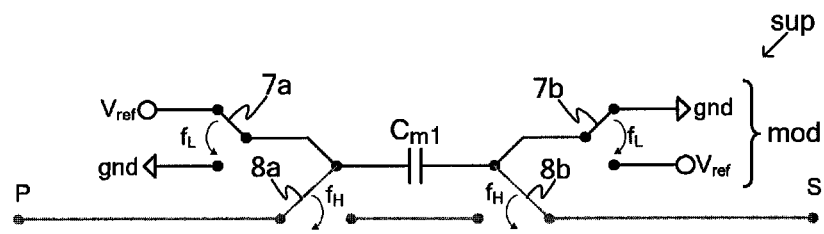
FIG. 4 is a schematic diagram of a superposition means of the exemplary embodiment of FIG. 3.

FIG. 4 shows an exemplary implementation of the superposition means of FIG. 3. The modulation means mod, which can be part of the superposition means sup, include a first capacitor $C_{m1}$ and first modulation switching means 7a and 7b to alternately charge the first capacitor $C_{m1}$ to either the analog reference voltage $V_{ref}$ or to an inverted analog reference voltage $-V_{ref}$, where the analog reference voltage $V_{ref}$ is a DC voltage. Further, the superposition means sup include first superposition switching means 8a and 8b, which can be configured to periodically include and exclude the first capacitor $C_{m1}$ in and from the current path of the analog voltage signal $V_{in}$, where the current path is indicated by the nodes P and S. The first superposition switching means 8a and 8b can be operated at a superposition frequency $f_H$ which is at least a hundred times higher than the inverse RC time constant of the RC filter which is made up by the first capacitor $C_{m1}$ and the first and second resistors $R_1$ and $R_2$, with the RC time constant being $T_0 = C_{m1} \cdot (R_1 + R_2)$.

Figure 5:
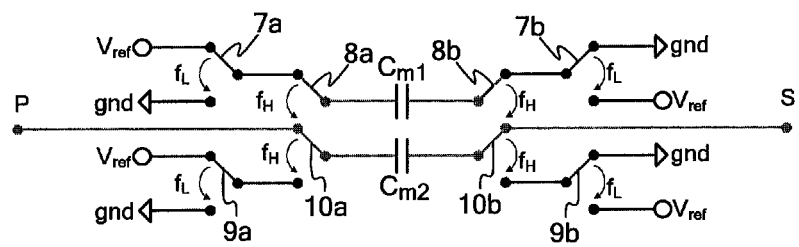
FIG. 5 is a schematic diagram of a superposition means of the exemplary embodiment of FIG. 3.
Figure 8:
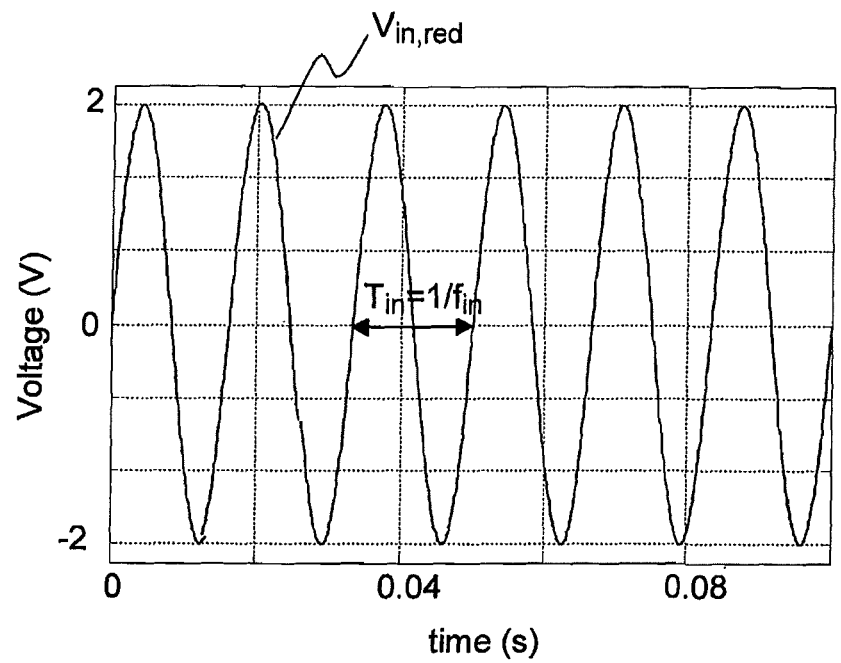
FIG. 8 illustrates time characteristics of an exemplary analog voltage signal.
Figure 9:
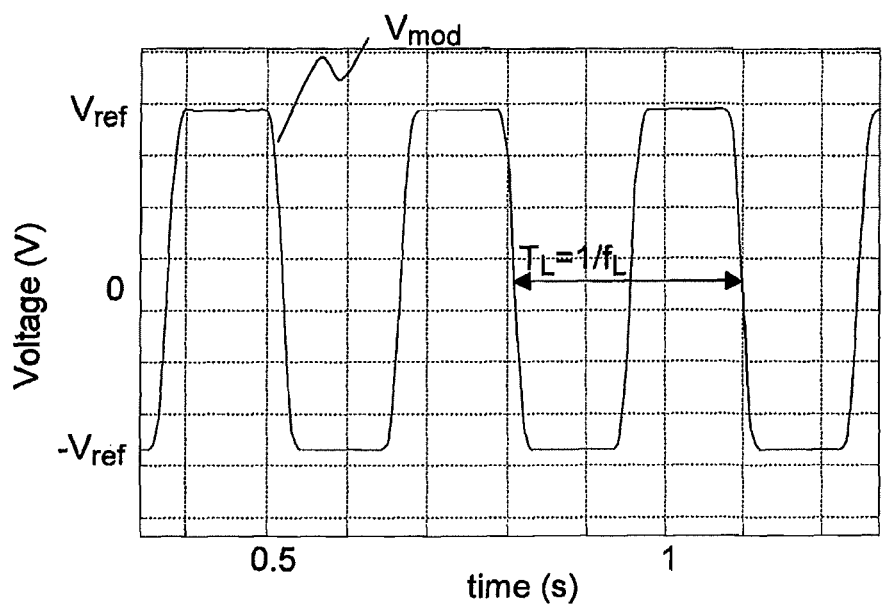
FIG. 9 illustrates time characteristics of an exemplary modulated reference voltage.
Figure 10:
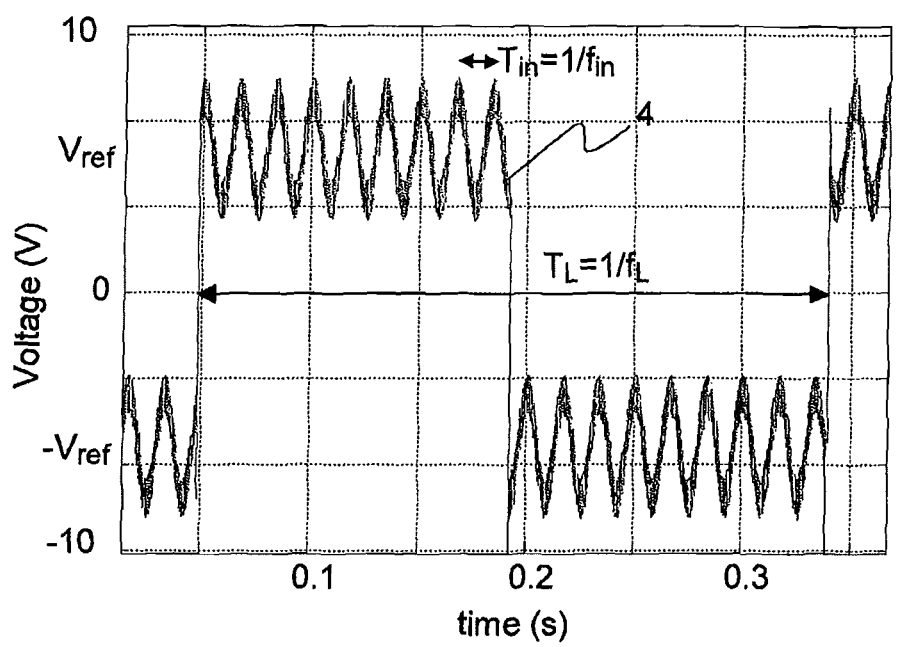
FIG. 10 illustrates time characteristics of the combined signal of FIGS. 8 and 9.

An exemplary implementation of the superposition means of FIG. 3 is depicted in FIG. 5, where this implementation differs from the implementation in FIG. 4 in that the modulation means include a second capacitor $C_{m2}$ and second modulation switching means 9a and 9b configured to be operated at the same modulation frequency $f_L$ as the first modulation switching means 7a and 7b. The second modulation switching means 9a and 9b can be configured to alternately charge the second capacitor $C_{m2}$ to either the analog reference voltage $V_{ref}$ or to the inverted analog reference voltage $-V_{ref}$. In addition, the superposition means sup include second superposition switching means 10*a* and 10*b* which can be configured to be operated at the same superposition frequency $f_H$ as the first superposition switching means 8*a* and 8*b*. The first and second superposition switching means 8*a*, 8*b*, 10*a*, and 10*b* can be configured to alternately include and exclude either the first capacitor $C_{m1}$ or the second capacitor $C_{m2}$ in and from the current path of the analog voltage signal $V_{in}$. Accordingly, in contrast to FIG. 3, the analog voltage signal $V_{in}$ is not directly applied to node S, but instead the first and second capacitors $C_{m1}$ and $C_{m2}$ can be charged with it. In the example of FIG. 5, all the switching means can be implemented as CMOS switches, so that the superposition frequency $f_H$ can be chosen above 1 kHz. The time characteristics of exemplary input, output and internal signals of the superposition means of FIG. 5 can be shown in FIGS. 8, 9 and 10. Due to the resistive voltage divider (FIG. 3), the AC analog voltage signal $V_{in}$, delivered by a Rogoswki coil, is reduced by the factor 100, resulting in the reduced analog voltage signal $V_{in,red}$ (FIG. 8). This is the signal which is applied to node P. The signal has a frequency of approximately 60 Hz. An appropriate ADC sampling rate for this frequency would be larger than 120 Hz, which results in a required superposition frequency of above 1.2 kHz. The modulated reference voltage $V_{mod}$ shown in FIG. 9 is generated from a DC analog reference voltage $V_{ref}$ of 5V amplitude and with a modulation frequency of about 7 Hz. The combined analog signal 4 of FIG. 10 is the direct result of the superposition of the two signals of FIGS. 8 and 9.

The exemplary embodiment of the present disclosure according to FIG. 3 can be used, for example, for single ended input signals, or in other words when the analog voltage signal is applied via one connection cable. In case that a differential input signal is to be applied via two connection cables, as is the case for Rogowski coils, for example, the exemplary embodiment of the present disclosure according to FIG. 6 can be used. In the exemplary embodiment of FIG. 6, further superposition means can be configured for generating a further combined signal 11 by superimposing an inverted modulated reference voltage $-V_{mod}$ onto the analog voltage signal $V_{in}$. The further superposition means can again be represented by a voltage source, but here its square wave signal is phase shifted by 180°. The further superposition means can again be connected to adjusting means, for example, to a resistive voltage divider including resistors $R_1$ and $R_2$. The output of the further superposition means is connected to the negative input of the differential amplifier amp. The analog voltage signal $V_{in}$ is applied between the inputs of the two adjusting means, for example, between the two resistors $R_1$ and $R_2$.

Figure 6:
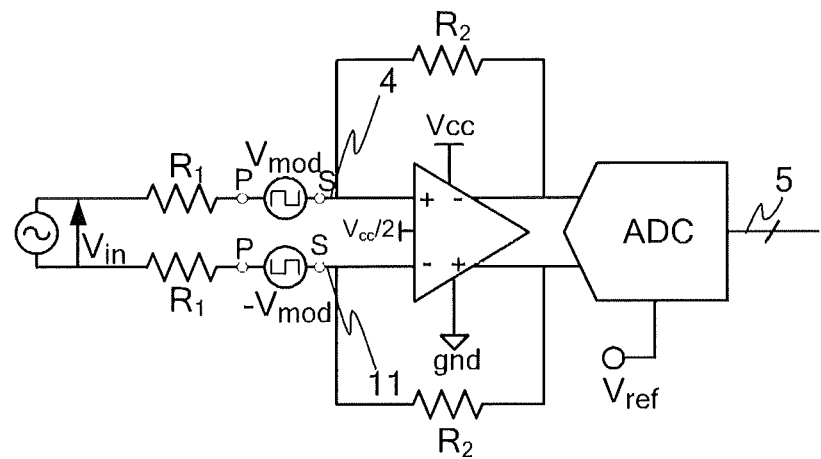
FIG. 6 is a schematic diagram of an arrangement according to an exemplary embodiment of the present disclosure.
Figure 7:
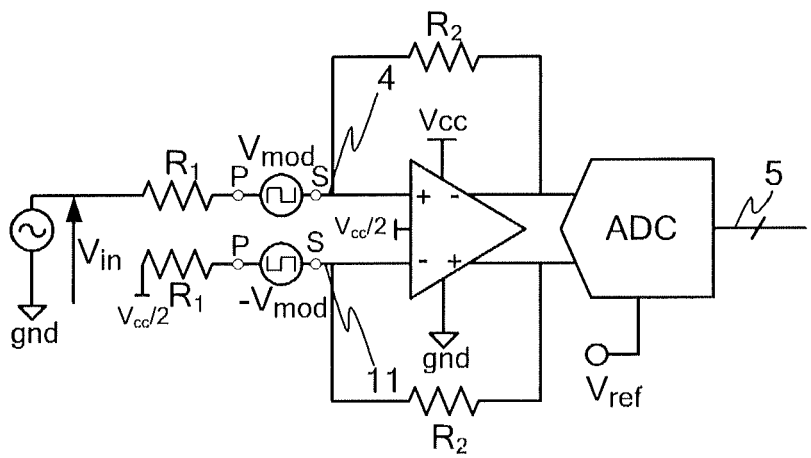
FIG. 7 is a schematic diagram of an arrangement according to an exemplary embodiment of the present disclosure.

In accordance with an exemplary embodiment of the present disclosure shown in FIG. 7, the exemplary embodiment of FIG. 6 is used for a single ended input signal. That is, the analog voltage signal Vin is applied between the input of the adjusting means belonging to the superposition means with the positive modulated reference voltage $V_{mod}$ and ground, while the input of the further adjusting means is connected to the middle potential $V_{cc}/2$ of the amplifier amp.

It will be appreciated by those skilled in the art that the present invention are embodied in other specific forms without departing from the spirit or essential characteristics thereof. The presently disclosed exemplary embodiments can be therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. An arrangement for reading out an analog voltage signal, the arrangement comprising:
   a voltage signal input for applying the analog voltage signal thereto;
   reference means for generating an analog reference voltage;
   converting means for converting an analog input signal into a digital output signal; and
   superposition means for receiving the analog voltage signal and the analog reference voltage,
   wherein the superposition means include modulation means for generating a modulated reference voltage from the analog reference voltage,
   wherein the superposition means are configured for generating a combined analog signal by superimposing the modulated reference voltage onto the analog voltage signal and for forwarding the combined analog signal to the converting means,
   wherein the superposition means comprise first superposition switching means for alternately applying either the analog voltage signal or the modulated reference voltage to a signal output of the superposition means,
   wherein the first superposition switching means are configured to be operated at a superposition frequency which is at least ten times higher than an analog to digital conversion (ADC) sampling frequency of the converting means,
   wherein the reference means are configured for generating a DC analog reference voltage,
   wherein the modulation means comprise a first capacitor and first modulation switching means for alternately charging the first capacitor to either the analog reference voltage or to an inverted analog reference voltage, and
   wherein the first superposition switching means are configured to periodically include and exclude the first capacitor in and from a current path of the analog voltage signal,
   wherein the modulation means comprise a second capacitor and second modulation switching means for alternately char in the second capacitor to either the analog reference voltage or to the inverted analog reference voltage,
   wherein the superposition means comprise second superposition switching means configured to be operated at a same superposition frequency as the first superposition switching means, and
   wherein the first and second superposition switching means are configured to alternately include and exclude either the first capacitor or the second capacitor in and from the current path of the analog voltage signal.

2. The arrangement according to claim 1, wherein the first and second superposition switching means and the first and second modulation switching means are semiconductor switches.

3. The arrangement according to claim 2, wherein the semiconductor switches includes CMOS switches.

4. The arrangement according to claim 1, wherein the first superposition switching means and the first modulation switching means are semiconductor switches.

5. The arrangement according to claim 4, wherein the semiconductor switches includes CMOS switches.

6. The arrangement according to claim 1, comprising:
   adjusting means for adjusting the analog voltage signal to a desired increased or decreased voltage level, the adjusting means being connected between the voltage signal input and the superposition means.

7. The arrangement according to claim 6, wherein the adjusting means include a resistive voltage divider.

8. The arrangement according to claim 7, wherein the first capacitor and the resistive divider form an RC-filter having an RC time constant, and
wherein the first and second superposition switching means are configured to be operated at the superposition frequency which is at least a hundred times higher than the inverse RC time constant.

9. The arrangement according to claim 1, wherein an output of the superposition means is connected to a positive input of a differential amplifier, and an output of the differential amplifier is connected to the converting means (ADC).

10. The arrangement according to claim 9, comprising:
adjusting means for adjusting the analog voltage signal to a desired increased or decreased voltage level, the adjusting means being connected between the voltage signal input and the superposition means; and
further superposition means whose inputs are connected to further adjusting means and to the reference means,
wherein the further superposition means are configured for generating a further combined signal by superimposing an inverted modulated reference voltage onto the analog voltage signal, and
wherein an output of the further superposition means is connected to a negative input of the differential amplifier.

11. The arrangement according to claim 1, wherein the arrangement is implemented as an application-specific integrated circuit.

12. An arrangement for reading out an analog voltage signal, the arrangement comprising:
a voltage signal input for applying the analog voltage signal thereto;
reference means for generating an analog reference voltage;
converting means for converting an analog input signal into a digital output signal; and
superposition means for receiving the analog voltage signal and the analog reference voltage,
wherein the superposition means include modulation means for generating a modulated reference voltage from the analog reference voltage,
wherein the modulation means are configured for generating a square wave modulated reference voltage,
wherein the superposition means are configured for generating a combined analog signal by superimposing the modulated reference voltage onto the analog voltage signal and for forwarding the combined analog signal to the converting means,
wherein the reference means are configured for generating a DC analog reference voltage,
wherein the modulation means comprise a first capacitor and first modulation switching means for alternately charging the first capacitor to either the analog reference voltage or to an inverted analog reference voltage, and
wherein the first superposition switching means are configured to periodically include and exclude the first capacitor in and from a current path of the analog voltage signal,
wherein the modulation means comprise a second capacitor and second modulation switching means for alternately charging the second capacitor to either the analog reference voltage or to the inverted analog reference voltage,
wherein the superposition means comprise second superposition switching means configured to be operated at the same superposition frequency as the first superposition switching means, and
wherein the first and second superposition switching means are configured to alternately include and exclude either the first capacitor or the second capacitor in and from the current path of the analog voltage signal.

13. The arrangement according to claim 12, wherein the first and second superposition switching means and the first and second modulation switching means are semiconductor switches.

14. The arrangement according to claim 12, comprising:
adjusting means for adjusting the analog voltage signal to a desired increased or decreased voltage level, the adjusting means being connected between the voltage signal input and the superposition means.

15. The arrangement according to claim 14, wherein the adjusting means include a resistive voltage divider.

16. The arrangement according to claim 15, wherein the first capacitor and the resistive divider form an RC-filter having an RC time constant, and
wherein the first and second superposition switching means are configured to be operated at the superposition frequency which is at least a hundred times higher than the inverse RC time constant.

17. The arrangement according to claim 16, wherein an output of the superposition means is connected to a positive input of a differential amplifier, and an output of the differential amplifier is connected to the converting means (ADC).

18. The arrangement according to claim 17, comprising:
further superposition means whose inputs are connected to further adjusting means and to the reference means,
wherein the further superposition means are configured for generating a further combined signal by superimposing an inverted modulated reference voltage onto the analog voltage signal, and
wherein an output of the further superposition means is connected to a negative input of the differential amplifier.

19. The arrangement according to claim 18, wherein the arrangement is implemented as an application-specific integrated circuit.

* * * * *

UNITED STATES PATENT AND TRADEMARK OFFICE
CERTIFICATE OF CORRECTION

PATENT NO. : 9,300,314 B2  
APPLICATION NO. : 14/054921  
DATED : March 29, 2016  
INVENTOR(S) : Joris Pascal et al.

Page 1 of 1

It is certified that error appears in the above-identified patent and that said Letters Patent is hereby corrected as shown below:

Claims  
Column 8, line 41, claim 1, "char in" should read -- charging --.

Signed and Sealed this  
Fourteenth Day of June, 2016

Michelle K. Lee  
*Director of the United States Patent and Trademark Office*